Figure 1:
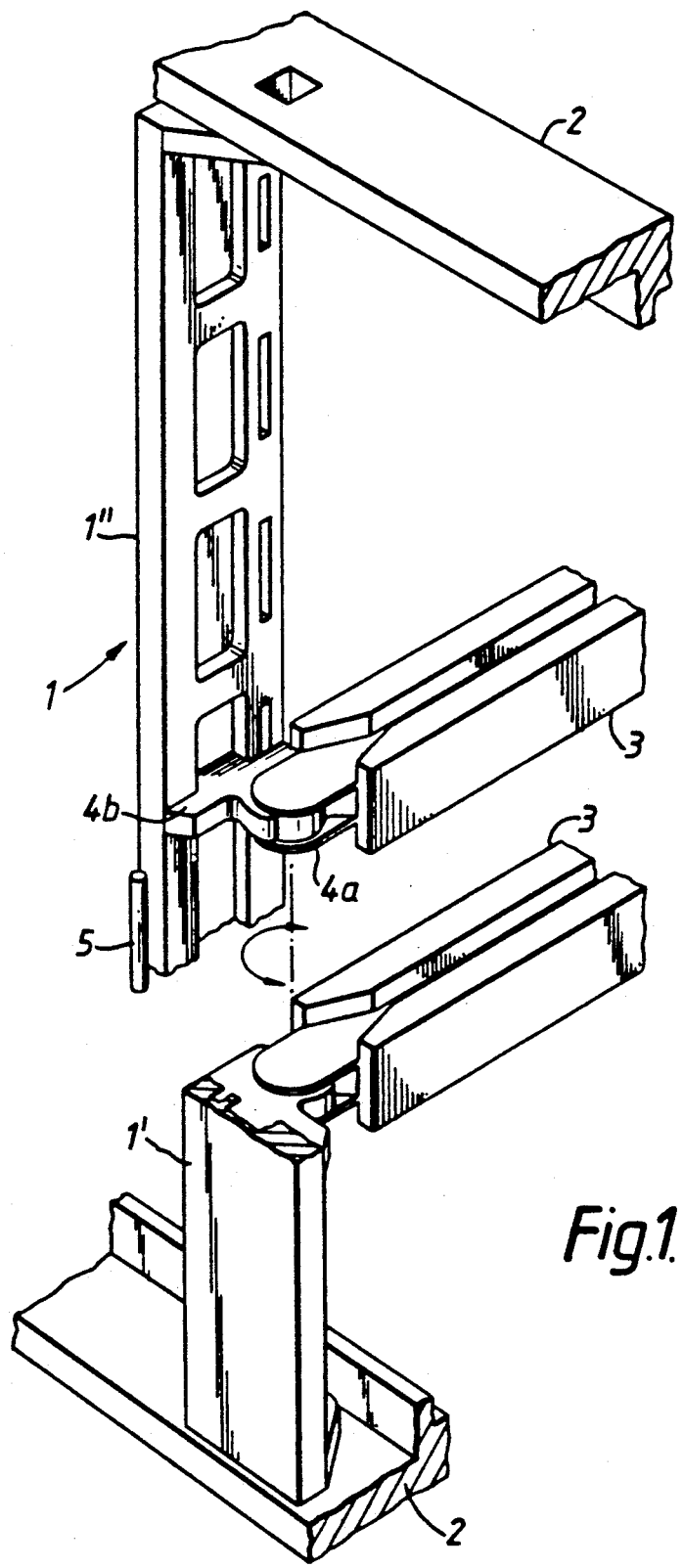

United States Patent [19]

Sykes et al.

[11] Patent Number: 5,086,933
[45] Date of Patent: Feb. 11, 1992

[54] PRINTED WIRING BOARD MOUNTING ASSEMBLY

[75] Inventors: David G. Sykes; Alan Jordan, both of Coventry, England

[73] Assignee: GEC Plessey Telecommunications Limited, Coventry, England

[21] Appl. No.: 544,424

[22] Filed: Jun. 27, 1990

[30] Foreign Application Priority Data

Aug. 31, 1989 [GB] United Kingdom ............... 8919725

[51] Int. Cl.$^5$ .......................................... A47B 63/00
[52] U.S. Cl. ............................................ 211/41; 211/4
[58] Field of Search .................. 211/41, 168, 47, 81, 211/96, 110, 199, 4, 195; 361/415

[56] References Cited

U.S. PATENT DOCUMENTS

| | | | |
|---|---|---|---|
| 966,333 | 8/1910 | Hemming | 211/96 X |
| 1,421,391 | 7/1922 | Bower | 211/40 |
| 3,181,706 | 5/1965 | Mandel | 211/163 |
| 3,960,273 | 6/1976 | Weston | 211/40 X |
| 4,569,143 | 2/1986 | Bannister | 211/199 X |

Primary Examiner—Alvin C. Chin-Shue
Assistant Examiner—Sarah Lechok
Attorney, Agent, or Firm—Fleit, Jacobson, Cohn, Price, Holman & Stern

[57] ABSTRACT

A mounting arrangement is provided for securing printed wiring boards within guide members. The guide members are arranged in a vertical plane and each guide member is provided with part of a knuckle arrangement. A further corresponding part of the knuckle arrangement is provided upon a vertical support structure, and the vertical support structure is allowed to pivot through 90° thereby closing the guides and securing the printed wiring boards therein, or alternatively permitting the guides to be opened to allow removal of the boards therefrom. The knuckle arrangement is so designed that the parts are snap-fitted together for ease of assembly and maintenance. The support arrangement is sufficiently rigid to prevent distortion when used, thus ensuring maximum component height.

8 Claims, 4 Drawing Sheets

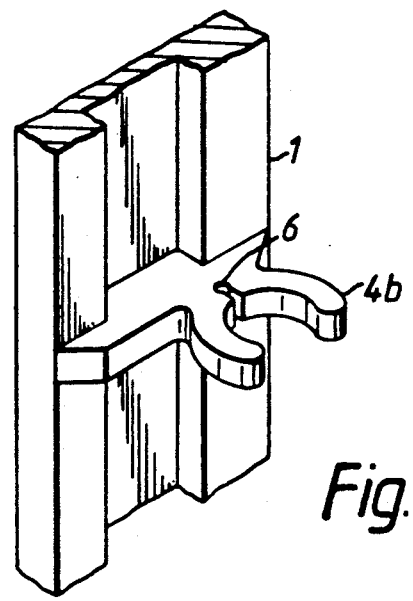
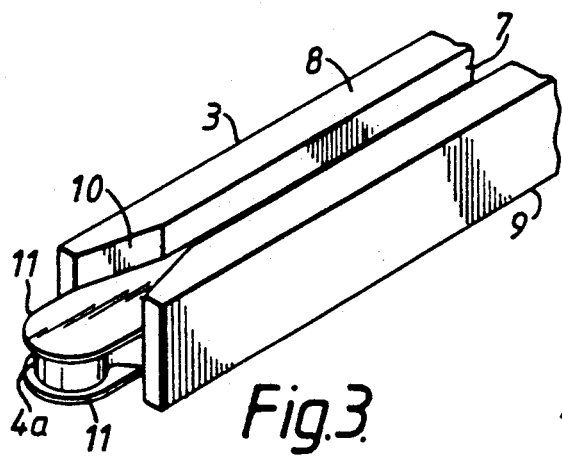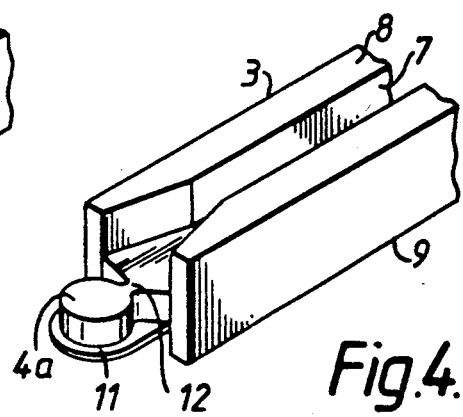
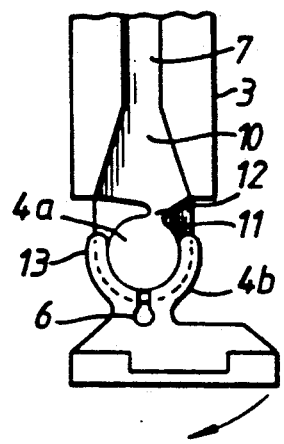

PRINTED WIRING BOARD MOUNTING ASSEMBLY

The present invention relates to a printed wiring board mounting assembly and is used to mount vertically a number of printed wiring boards in the same occupancy as a double Eurocard (DIN 41492), and engage DIN connectors mounted on a board at right angles to the board without reducing component height caused by structure, or weakness in structure allowing distortion.

Traditionally, System X line units have eight subscribers line circuits on one printed wiring board, when one circuit fails seven others have to be disconnected whilst the line unit is replaced. The device according to the present invention enables the line unit to be very small and carry only two subscribers thereby providing obvious advantages.

The mounting assembly according to the present invention overcomes these problems by placing the supporting structure in front of the printed wiring boards, outside the component area, and which is allowed to move to one side to gain access to the unit.

According to the present invention there is provided a printed wiring board mounting assembly comprising at least one vertical support structure pivotally mounted at respective ends of the vertical support structure on respective cross-members, and at least two printed wiring board guides arranged in a vertical plane and incorporating means at an end of each guide to secure the guide to a backplane, the opposite end of each guide is arranged to rotatably co-operate with the vertical support structure, so that the vertical support structure can be rotated to a first position permitting access to the guides, and arranged to be rotated to a second position preventing access to the guides.

Figure 6:
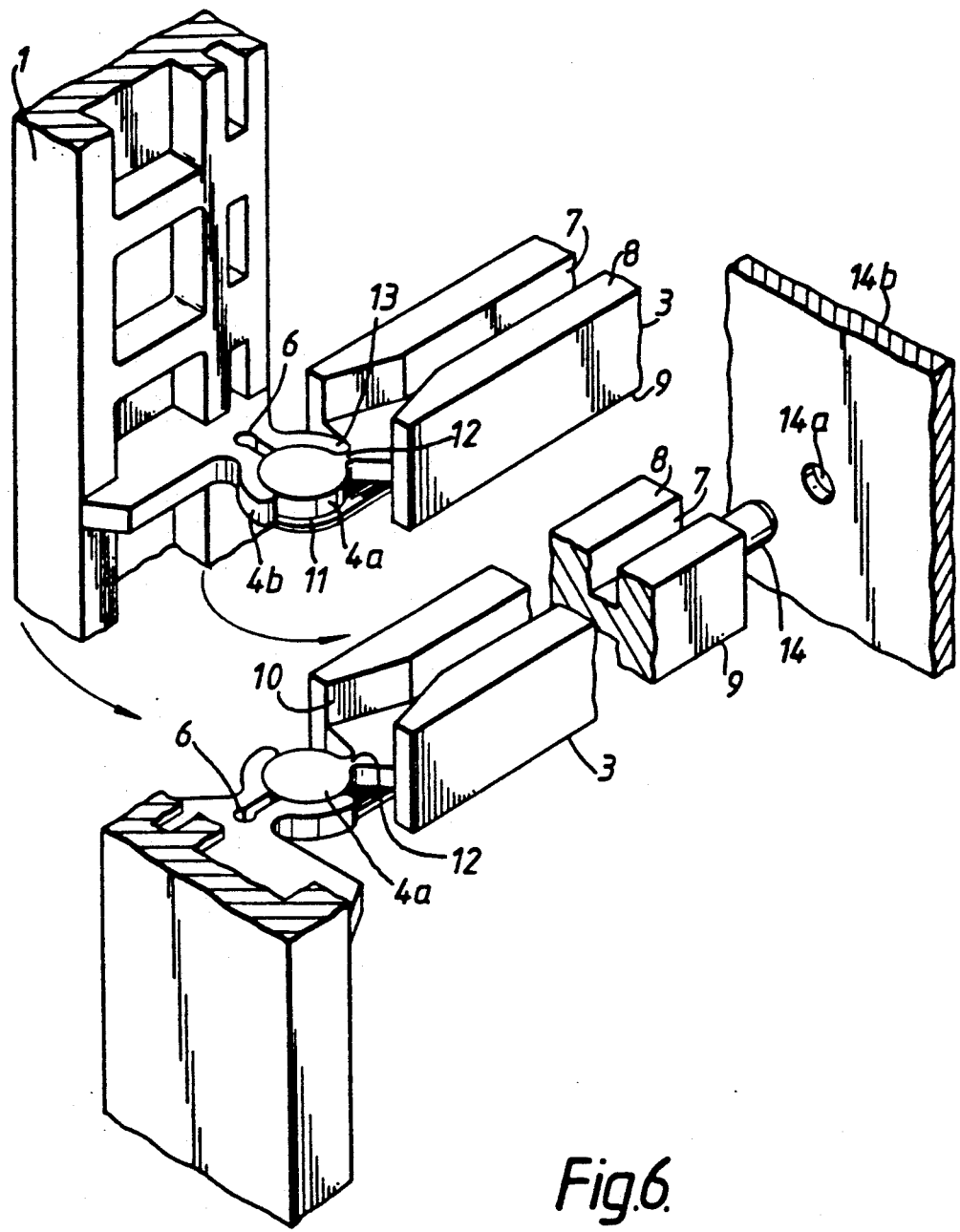
Figure 7:
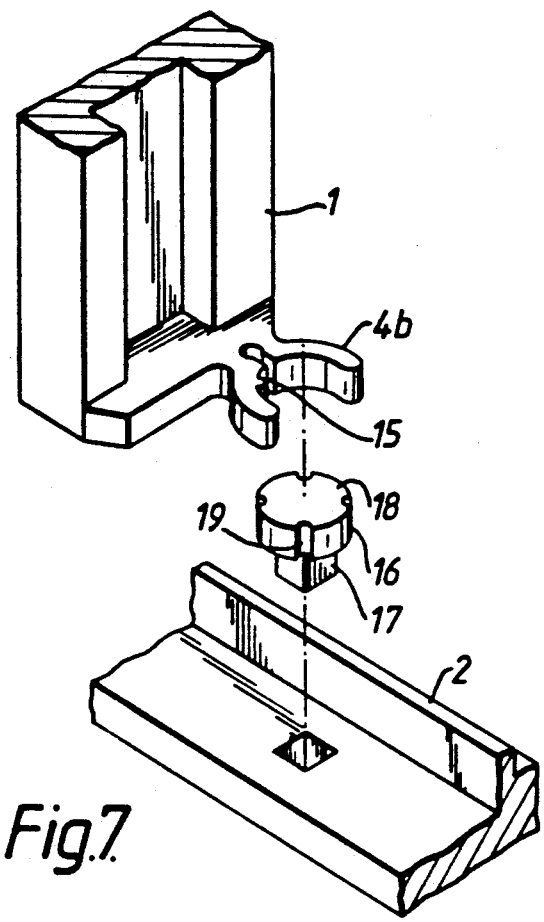
Figure 8:
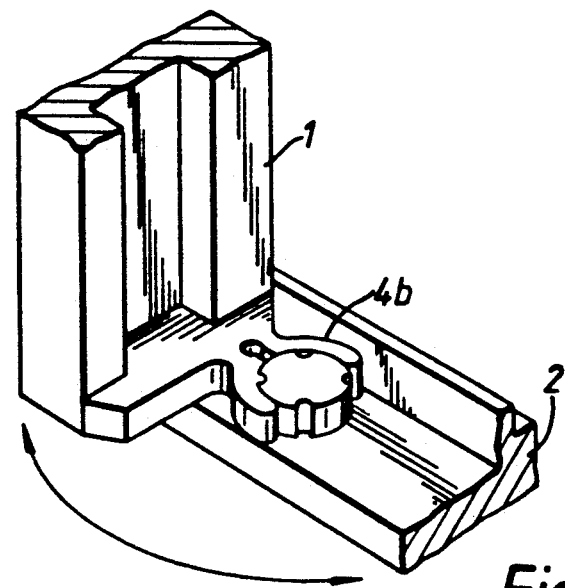

An embodiment of the present invention will now be described with reference to the accompanying drawings, wherein, FIG. 1 shows a perspective view of the mounting arrangement with a vertical support structure shown in an open and closed position, FIG. 2 shows a portion of the vertical support structure showing part of the mechanism by which the central guides are connected, FIG. 3 shows a central guide having a further part of the mechanism arranged to mate with that part shown in FIG. 2, FIG. 4 shows a guide having a further part of the mechanism arranged to mate with that part of the mechanism shown in FIG. 2, FIG. 5 shows a plan view of a guide in co-operation with the mechanism attached to a vertical support structure, FIG. 6 shows a perspective view of a pair of guides connected to the vertical support structure and shown in the open and closed positions, FIG. 7 shows an exploded view of the way in which the vertical support structure is pivotally connected to a cross member, and, FIG. 8 shows a perspective view of a vertical support structure co-operating with the cross member for rotational movement.

Referring to the drawings, and firstly FIGS. 1 and 2, the mounting assembly is shown and comprises a vertical support structure 1 pivotly connected to a pair of aluminium cross-members 2 which run substantially parallel with the vertical support structure 1 located therebetween. Two printed wiring board guides 3 are shown, which are arranged to co-operate with the vertical support structure 1 by means of a knuckle arrangement 4a, 4b. The knuckle arrangement 4a, 4b comprises two sections. The first, 4a forms part of the guide 3 and is in the form of a protruding knuckle of disc shape. The second, 4b forms the second part of the knuckle arrangement and comprises a substantially C-shaped clip-like arrangement which is arranged to co-operate with the protruding knuckle 4a in snap-fit relationship. The vertical support structure 1 is shown in two positions the first, 1' is in the closed position and the second 1" is in the open position whereby it is rotated through 90°. The vertical support structure 1 is provided with a fingernail catch 5 to enable an operator to easily rotate the structure 1 between the closed and open position.

Referring to FIG. 2, a section of the vertical support structure is shown bearing one of the semi-circular clip arrangements 4b which form part of the knuckle arrangement. It will be appreciated that a number of clip arrangements 4b are provided throughout the length of the structure 1 so that each will mate with a respective knuckle of a guide 3. The arrangement 4b is made of a pliable material such as plastic and is formed integral with the structure 1. However it should be appreciated that the arrangement 4b could be a separate item and secured to the vertical structure 1 by suitable means. The arrangement 4b is substantially C-shaped and has a shape and size such that the gap between respective limbs of the arrangement is smaller than the diameter of the corresponding knuckle arrangement 4a of a guide 3. Because the material is pliable the knuckle 4a of a guide 3 can be inserted between the limbs of the arrangement 4b which will be forced in an outward direction thereby allowing the knuckle 4a to be clipped into the C-shaped arrangement 4b. To assist in urging apart the limbs of the arrangement 4b, a slot 6 is provided in the base of the C-shaped arrangement section to increase the pliability. The section 4b is situated close to an edge of the vertical structure 1 which is opposite to the edge upon which the fingernail catch is positioned to enable the vertical structure to be easily rotated in hinge-like fashion.

Referring to FIG. 3, a printed wiring board guide will now be described. The guide comprises a longitudinal section 3 bearing a longitudinal groove 7 in upper and lower faces 8 and 9 respectively, of the guide 3. At one end of the groove 7, the end in which the printed wiring board is to be inserted, the groove has a wider portion 10 which helps to direct the board into the groove 7. At the same end of the guide 3, a substantially circular knuckle 4a protrudes from the guide 3. The knuckle portion 4a has upper and lower flanges 11 which protrude beyond the circular knuckle. The size of the knuckle is such that it co-operates with the knuckle member 4b, urging the limbs of the C-shaped arrangement apart. When the section 4a located in the section 4b, the upper and lower flanges 11 rest upon respective surfaces of the C-shaped arrangement, 4b and prevent vertical movement of the guide. This knuckle arrangement is commonly known as a central knuckle there usually being only one provided in any vertical section, since only one is needed to prevent any vertical movement.

Referring to FIG. 4, a guide arrangement is shown which is substantially the same as that described with reference to FIG. 3; however, it will be seen that the knuckle arrangement 4a only comprises one flange section 11. This type of guide arrangement is used in any other position on the vertical section 1, and serves to prevent vertical movement of the guide 3 in association with the central knuckle arrangement of that shown in FIG. 3.

Referring now to FIG. 5, a plan view is shown of a guide member such as that shown in FIG. 4, clipped in position on each respective knuckle section 4b. It will readily be appreciated that the knuckle section 4a which effectively is shown upon the flange section 11 is provided with an offset neck portion 12. The positioning of section 12 in the design is critical in so far that it is this neck section which determines the rotational movement of the knuckle section 4b. The position of the knuckle section 4b and hence the position of the vertical section 1, as shown is in the closed position, and it will be appreciated that the vertical section 1 when rotated in the direction of the arrow, permits the section 1 to be moved to an open position and the distance between the neck portion 12 and the limb extremity is such that the vertical section 1 is allowed to be rotated through 90° to its open position. This will readily be appreciated by reference to FIG. 6 described hereafter.

Referring to FIG. 6, the vertical section 1 is shown in its open and closed positions. When in its open position the knuckle section 4b is shown rotated through 90° with its extremity 13 resting against the neck portion 12. FIG. 6 shows a knuckle arrangement having only one flange section 11 as described above with reference to FIG. 4. The guide 3, at the end remote from the knuckle arrangement 4a, 4b is shown having a protrusion 14, the purpose of which is to be located within a hole 14a of a backplane 14b, thereby securing the guide in the respective correct horizontal position. Therefore it will be appreciated that the positioning of the respective knuckle section 4b on the vertical structure 1 has to be precise to enable the guide members 3 to be kept in correct horizontal relationship.

Referring now to FIGS. 7 and 8, the manner in which the lower and upper ends of the vertical structure 1 is connected to the cross-members will now be described. At each end of the vertical structure 1 there is a knuckle arrangement 4b. The knuckle arrangement 4b has one modification to it in the form of a protrusion 15 in an inner surface of the C-shaped arrangement. The respective cross-members 2 are provided with a square hole in which is located a pivot arrangement 16. The pivot arrangement 16 has a square base 17, the dimensions of which permit insertion of the square section into the hole. The pivot 16 further comprises a cylindrical section 18, the diameter of which is slightly larger than C-shaped arrangement of the knuckle section 4b so that when the section 4b is located around the cylindrical section 18, the limbs of the C-shaped arrangement are urged apart. The cylindrical section 18 has at least two slots 19 which are longitudinal with respect to the cylindrical section 18 and the purpose of slots 19 is to accommodate the protrusion 15, previously discussed. The slots 19 are placed 90° apart and when in operation they serve to act as the locking mechanism in conjunction with the protrusion 15 so that the vertical section 1 is held in a locked condition when the vertical structure 1 is both in the open and closed positions.

It will be appreciated by those in the art that the above description as been of one embodiment, and variations within the scope of spirit in the present invention will be readily envisaged by those skilled in the art. For example the respective positions of the knuckle elements 4a, 4b could be interchanged.

We claim:

1. A printed wiring board mounting arrangement comprising:
    a pair of substantially parallel cross-members,
    at least one vertical support structure extending between said cross-members and pivotally mounted, at respective ends of the vertical support structure, on said cross-members,
    at least two printed wiring board guides arranged substantially parallel to each other and to said cross-members and in a vertical plane,
    a first knuckle arrangement interconnecting a first end of each guide to said vertical support structure so that the vertical support structure is rotatable between first and second positions, relative to said guides,
    means at a second end of each guide for securing the guide to a backplane, the vertical support structure being rotatable to said first position, permitting access to the guides, and to said second position, preventing access to the guides, and
    a second knuckle arrangement interconnecting each of the upper and lower ends of said vertical support structure to one of the cross-members, each second knuckle arrangement forming a locking mechanism so that said vertical support structure is held in a locked condition when it is in both the first position and the second position.

2. A mounting arrangement as claimed in claim 1, wherein each guide is provided with a first knuckle part, and the vertical support structure is provided with a respective second knuckle part, said knuckle parts being positioned in such manner to enable the first and second knuckle parts to be mated to form one of said first knuckle arrangements.

3. A mounting arrangement as claimed in claim 2, wherein the first knuckle part is a disc having opposed faces and the second knuckle part comprises a substantially C-shaped arrangement having opposed limbs and made of a resilient material, permitting said first knuckle part to be snap-fitted into said second knuckle part.

4. A mounting arrangement as claimed in claim 3, wherein the second knuckle part is provided with a slot, and the C-shaped arrangement is dimensioned such that it urges apart the opposed limbs as the first part is inserted within the C-shaped arrangement, said slot assisting in urging apart the limbs.

5. A mounting arrangement as claimed in claim 3, wherein said disc of the first knuckle part is provided with at least one flange which is used to abut against a surface of said second knuckle part to prevent vertical movement therebetween.

6. A mounting arrangement as claimed in claim 4, wherein said disc of said first knuckle part is provided with two flanges, each being upon said opposed faces of the disc.

7. A mounting arrangement as claimed in claim 6, wherein the disc is provided with a neck which is offset and which determines the amount of rotation between said first and second knuckle parts.

8. A mounting arrangement as claimed in claim 1, wherein a second knuckle arrangement includes a protrusion, a pivot arrangement is provided which has means for securing said pivot arrangement in said cross-members and is provided with locking means to cooperate with said protrusion to lock the second knuckle part onto the pivot arrangement.

* * * * *